(12) United States Patent
Sato et al.

(10) Patent No.: US 12,534,592 B2
(45) Date of Patent: Jan. 27, 2026

(54) METAL PASTE

(71) Applicant: TANAKA KIKINZOKU KOGYO K.K., Tokyo (JP)

(72) Inventors: Hiroki Sato, Tsukuba (JP); Yuki Fujita, Tsukuba (JP); Teruhisa Iwai, Tsukuba (JP); Yuusuke Ohshima, Tsukuba (JP); Shuntaro Takahashi, Tsukuba (JP); Shigeyuki Ootake, Tsukuba (JP)

(73) Assignee: TANAKA PRECIOUS METAL TECHNOLOGIES Co., Ltd., Tokyo (JP)

( * ) Notice: Subject to any disclaimer, the term of this patent is extended or adjusted under 35 U.S.C. 154(b) by 0 days.

(21) Appl. No.: 18/700,705

(22) PCT Filed: Oct. 4, 2022

(86) PCT No.: PCT/JP2022/037047
§ 371 (c)(1),
(2) Date: Apr. 12, 2024

(87) PCT Pub. No.: WO2023/063158
PCT Pub. Date: Apr. 20, 2023

(65) Prior Publication Data
US 2024/0336763 A1    Oct. 10, 2024

(30) Foreign Application Priority Data

Oct. 15, 2021   (JP) ................................. 2021-169895

(51) Int. Cl.
| | |
|---|---|
| *C08K 3/08* | (2006.01) |
| *B22F 1/102* | (2022.01) |
| *B22F 1/107* | (2022.01) |
| *B22F 1/145* | (2022.01) |
| *C08L 29/14* | (2006.01) |
| *H01B 1/22* | (2006.01) |
| *H05K 1/09* | (2006.01) |

(52) U.S. Cl.
CPC ............... *C08K 3/08* (2013.01); *B22F 1/102* (2022.01); *B22F 1/107* (2022.01); *B22F 1/147* (2022.01); *C08L 29/14* (2013.01); *H01B 1/22* (2013.01); *H05K 1/09* (2013.01); *H05K 1/092* (2013.01); *B22F 2301/255* (2013.01); *C08K 2003/0806* (2013.01)

(58) Field of Classification Search
CPC ............ H05K 1/09; H05K 1/092; H01B 1/22
See application file for complete search history.

(56) References Cited

U.S. PATENT DOCUMENTS

| | | | |
|---|---|---|---|
| 6,372,158 B1 * | 4/2002 | Hashimoto | H01B 1/22 252/514 |
| 2015/0232709 A1 | 8/2015 | Matsui et al. | |
| 2017/0130084 A1 | 5/2017 | Kell et al. | |
| 2018/0193913 A1 * | 7/2018 | Iwai | H01C 17/06526 |
| 2019/0119519 A1 * | 4/2019 | Watanabe | C09C 3/08 |
| 2019/0327839 A1 * | 10/2019 | Liu | H05K 3/4664 |

FOREIGN PATENT DOCUMENTS

| | | | | |
|---|---|---|---|---|
| CN | 111243778 A | 6/2020 | | |
| JP | 2007-081339 A | 3/2007 | | |
| JP | 2012-174797 A | 9/2010 | | |
| JP | 2017-524761 A | 8/2017 | | |
| JP | 2018083930 A * | 5/2018 | | B41J 2/01 |
| JP | 6491753 B2 | 3/2019 | | |
| JP | 2021-006610 A | 1/2021 | | |
| TW | 201410836 A | 3/2014 | | |
| TW | 201637026 A | 10/2016 | | |
| WO | WO-2017/033911 A1 | 3/2017 | | |

OTHER PUBLICATIONS

Machine translation of JP 2018-083930 (2018, 57 pages).*
Japanese Patent Office, "Decision to Grant a Patent," issued in connection with Japanese Patent Application No. 2021-169895, dated Nov. 28, 2022.
Taiwanese Patent Office, "Office Action with Search Report," issued in connection with Taiwanese Patent Application No. 111138186, dated May 31, 2023.
International Searching Authority, "International Search Report," issued in connection with International Patent Application No. PCT/JP2022/037047, dated Dec. 6, 2022.
International Searching Authority, "Written Opinion," issued in connection with International Patent Application No. PCT/JP2022/037047, dated Dec. 6, 2022.

* cited by examiner

*Primary Examiner* — Brieann R Johnston
(74) *Attorney, Agent, or Firm* — Foley & Lardner LLP

(57) ABSTRACT

The present invention relates to a metal paste for forming a metal wiring containing a solid content of a silver particle and kneaded with a solvent. The solid content of the metal paste contains a silver particle having prescribed particle size distribution and average particle size, and using an amine compound as a protective agent. The solvent is a mixed solvent in which two organic solvents of a solvent A and a solvent B are mixed. The solvent A is dihydroterpineol or terpineol, and the solvent B is at least one organic solvent having a boiling point of 240° C. or more. The mixed solvent has a Hansen solubility parameter distance Ra from dihydroterpineol of 3.0 MPa$^{1/2}$ or less. The metal paste further contains a high molecular weight ethyl cellulose as a first additive, and a polyvinyl acetal resin as a second additive.

4 Claims, 3 Drawing Sheets

SOLVENT: BUTYL GLYCOL ACETATE

SOLVENT: DIHYDROTERPINEOL

METAL PASTE

CROSS-REFERENCE TO RELATED APPLICATIONS

The present application claims priority under 35 U.S.C. § 371 to International Patent Application No. PCT/JP2022/037047, filed Oct. 4, 2022, which claims priority to and the benefit of Japanese Patent Application No. 2021-169895, filed on Oct. 15, 2021. The contents of these applications are hereby incorporated by reference in their entireties.

BACKGROUND OF THE INVENTION

Field of the Invention

The present invention relates to a metal paste in which a silver particle is dispersed in a solvent. More particularly, it relates to a metal paste that contains, as a solid content, a silver particle having prescribed average particle size and particle size distribution, is excellent in low temperature sinterability, and is excellent in printing drawability capable of forming a metal wiring according to designed pattern and wiring width. Further, it relates to a metal paste having favorable continuous printability, and capable of forming a wiring excellent in adhesiveness to a substrate.

Description of the Related Art

In formation of metal wirings of LED elements for display light sources and power semiconductor devices of PCs, smartphones, tablet devices and the like, a metal paste containing a metal particle dispersed in a solvent (metal ink) has become widely used in recent years. A metal paste is easily applicable to efficient pattern formation technology such as screen printing method, and can be used for formation of a fine wiring pattern. For these reasons, a wiring forming process by printing a metal paste is expected as an alternative to conventionally mainly employed photoresist method, plating method and the like.

As a metal paste suitable to such wiring formation application, the present applicant has disclosed a metal paste containing a silver nanoparticle having a prescribed configuration (Patent Document 1). When in the form of a nano-level fine particle of several tens nm or less, a metal particle exhibits a phenomenon that a melting point thereof remarkably reduces as compared with a bulk material. The metal paste disclosed by the present applicant utilizes this phenomenon, and contains, as a metal component, a silver nanoparticle having controlled average particle size and particle size distribution, and is capable of wiring formation at a low temperature. Besides, this conventional metal paste contains a high molecular weight ethyl cellulose as an additive. A metal paste is required of printability for transferring, to a substrate, a metal particle accurately according to a designed fine wiring pattern shape. In this respect, a metal paste containing only a metal nanoparticle dispersed in a solvent is poor in printability, and may form a wiring having running or disconnection in some cases. Since the metal paste of the present applicant contains the high molecular weight ethyl cellulose, the rheology characteristic of the metal paste is made preferable to improve its printability. Owing to these configurations, the metal paste of the present applicant is deemed to sufficiently usable in the wiring forming process for various applications.

PRIOR ART DOCUMENT

Patent Document

Patent Document 1 Japanese Patent No. 6491753

SUMMARY OF THE INVENTION

Technical Problem

In wiring patterns of the electronic devices such as LED elements, wiring widths have been further narrowed, and shapes have been made further complicated. Specifically, a wiring width conventionally set to be over 100 μm is required to be 100 μm or less, and a width of about 50 μm is expected to be realized in the future.

Regarding use of a metal paste in such a narrowed/complicated wiring pattern, the metal paste of the present applicant is usable to some extent, but cannot be regarded sufficient. For example, regarding the narrowing of a wiring width, it has been confirmed that a wiring having a width slightly larger than a designed value may be formed in some cases even when the metal paste of the present applicant is used. In the present invention, printing drawability is defined as whether or not a wiring having a designed wiring width can be formed. Metal pastes in the future need to be excellent in this printing drawability, and it has been confirmed that there is a room of improvement also in the metal paste of the present applicant.

It seems that the narrowing/complication of a wiring pattern can be coped with from a direction of improvement of printing technique, for example, by improving a printer. It is, however, deemed that improvement of a metal paste containing a metal particle corresponding to a precursor of a wiring is essential.

Although improvement of the printing drawability of a metal paste is significant, it should be avoided that properties originally required of the metal paste are impaired by changing the configuration of the metal paste. Specifically, the low temperature sinterability and printability of the metal paste of the present applicant are essential. In improvement of the metal paste, it is essential to maintain such basic required properties.

In a production process for wiring substrates of mass produced electric/electronic devices, it is necessary to continuously form the same wiring patterns continuously/stably. Besides, it is necessary to maintain a state in which a wiring pattern once formed is joined to a substrate with favorable adhesion. It is predicted that the narrowing of a wiring pattern would affect continuous printability, and adhesion to a substrate, and therefore, it is necessary to consider a balance with these in the improvement of the printing drawability.

The present invention was devised under this background, and provides a metal paste for wiring formation containing a metal particle of a silver particle as a solid content, and capable of forming a wiring in a wiring width/pattern as designed to cope with the narrowing of a wiring width and the like. In addition, the present invention reveals a metal paste having favorable printing drawability, and capable of ensuring continuous printability and adhesion of a wiring.

Solution to Problem

The printing drawability of a metal paste, which is a problem to be solved by the present invention, is evaluated according to the size of deviation of a width of a formed wiring from a designed width. While evaluating the printing drawability of the conventional metal paste of the present applicant, the present inventors have performed a preliminary test on a factor of reduction of the printing drawability. As a result, it has been considered that the printing drawability of a metal paste is largely affected by a solvent. Then, the present inventors have started to study a solvent capable of improving the printing drawability, resulting in finding that it is effective to use dihydroterpineol (menthanol) or terpineol as a solvent. In particular, dihydroterpineol can be an optimum solvent, and it has been confirmed that the printing drawability can be made favorable by using this. Contents of the preliminary test conducted by the present inventors will be described below, and it has been confirmed that deviation from a designed width is extremely small in forming a wiring pattern using a metal paste containing dihydroterpineol as a solvent.

In a metal paste containing dihydroterpineol or the like as a solvent, however, although the printing drawability can be improved, the effect is exhibited only for a short term, and since wirings become blurred after performing printing a plurality of times, it has been unavoidably determined that the effect is insufficient in continuous printability. In addition, adhesion of a wiring cannot be improved by using any solvents including dihydroterpineol.

Therefore, the present inventors have considered that although the problems of the printing drawability and the continuous printability can be solved by a solvent, another means should be applied for the adhesion.

(I) Improvement of Printing Drawability and Continuous Printability by Solvent

As described above, dihydroterpineol is a solvent that can be the best in printing drawability, but is inferior in continuous printability. The reason why dihydroterpineol minimizes deviation and improves drawability is not clear. As a hypothesis made by the present inventors, it is considered, but not certain, that dihydroterpineol or the like works as a buffering agent/protective agent of a silver particle (and a protective agent thereof) to inhibit excessive spread otherwise caused in printing by interaction between the solvent and the silver particle. On the other hand, it has been presumed that one factor of dihydroterpineol reducing the continuous printability is volatilization of the solvent during printing. When it is assumed that the reduction of the continuous printability is caused by volatilization of the solvent, it can be considered that the continuous printability can be improved by mixing a solvent having a higher boiling point with dihydroterpineol or the like to increase a boiling point of the whole solvent.

When another solvent is mixed with dihydroterpineol or the like, however, it is predicted that the drawability attained by dihydroterpineol or the like may be reduced. According to a preliminary test conducted by the present inventors, when a solvent excluding dihydroterpineol or the like is used, the deviation is liable to wholly increase. Therefore, application of a mixed solvent simply for adjusting a boiling point is not preferable. Accordingly, the present inventors considered that if the factor of improving the printing drawability is the interaction between the solvent and the silver particle, a solvent capable of exhibiting interaction similar to that of dihydroterpineol or the like should be formed.

Here, the present inventors have made examination based on a Hansen solubility parameter as a direction for forming a solvent having close properties to dihydroterpineol or the like. The Hansen solubility parameter (hereinafter sometimes abbreviated as HSP) is one of methods for prescribing a solubility parameter of a solvent. The HSP is a vector expressed in a three-dimensional space with what is called a Hilderbrand solubility parameter (SP value) divided into three components of a dispersion term ($\delta d$), a polar term ($\delta p$), and a hydrogen bond term ($\delta h$). The HSP is generally introduced to estimate affinity between a solvent and a solute, and is used for presuming to what extent a given solvent can dissolve a given solute. In this respect, in a metal paste corresponding to a target of the present invention, a metal particle (silver nanoparticle) is in a state of being dispersed in a solvent, and is not dissolved in the solvent. Regarding behavior occurring between a solvent and a metal particle, however, it is considered that solvents having approximate HSPs exhibit similar behaviors. In particular, the conventional metal particle of the present applicant is protected by a prescribed organic compound (amine compound), and hence, it has been considered that the HSP is useful for considering the behavior between a solvent, that is, an organic compound, and a metal particle.

Then, as a result of studies made based on the HSP, the present inventors have found that a mixed solvent that is a solvent having a boiling point of a prescribed temperature or higher, and having a HSP distance Ra from dihydroterpineol of equal to or less than a prescribed value when mixed is excellent both in the printing drawability and the continuous printability.

(II) Improvement of Adhesion of Wiring

As described above, the printing drawability and the continuous printability can be improved by using an appropriate mixed solvent. On the other hand, the adhesion cannot be expected to be improved by a solvent. Therefore, the present inventors have decided to use, as means for improving the adhesion of a metal paste, a novel additive in the conventional technique. In this respect, in the conventional metal paste of the present applicant, a high molecular weight ethyl cellulose is added as an additive for improving printability, and a low molecular weight ethyl cellulose (number average molecular weight: 10000 to 25000) is optionally added for further improving a thixotropic property of the metal paste. As a result of studies based on this conventional technique, the present inventors have found that use of the high molecular weight ethyl cellulose is essential for the basic printability, and that an action of improving the adhesion can be obtained by using a polyvinyl acetal resin as a novel additive instead of the low molecular weight ethyl cellulose.

In this manner, the present inventors have found solution means respectively for the improvement of the printing drawability and the continuous printability, and the improvement of the adhesion of a wiring, and thus, the present invention has been accomplished. Specifically, the present invention is drawn to a metal paste comprising a solid content of a silver particle having a protective agent bound thereto and kneaded with a solvent, in which the solid content contains silver particles including a silver particle having a particle size of 100 to 200 nm in a ratio of 30% or more in terms of the number of particles, an average particle size of the whole silver particles is 60 to 800 nm, the protective agent bound to the silver particle is at least one amine compound having 4 or more and 8 or less carbon atoms, the solvent is a mixed solvent in which at least two organic solvents of a solvent A and a solvent B are mixed, the solvent A is at least either dihydroterpineol (dihydroterpineol) or terpineol, the solvent B is at least one organic solvent having a boiling point of 240° C. or more, the mixed solvent has a Hansen solubility parameter distance Ra from dihydroterpineol of 3.0 $MPa^{1/2}$ or less, and the metal paste further contains a high molecular weight ethyl cellulose having a number average molecular weight of 40000 to 90000 as a first additive, and a polyvinyl acetal resin as a second additive. Now, the metal paste of the present invention, and a method for forming a metal wiring pattern using the same will be described.

(A) Metal Paste of Invention

As described above, the metal paste of the present invention contains, as essential configurations, (1) a solid content of a silver particle, (2) a solvent of a mixture of a solvent A and a solvent B, and (3) first and second additives. Now, these configurations of the metal paste of the present invention will be described.

(1) Silver Particle

The metal paste of the present invention contains a solid content of a silver particle that is a precursor of a metal wiring. A silver particle is employed because silver is a metal having a low specific resistance, and a sintered body thereof can effectively act as a conductive film. Silver is used also based on that it has an advantage of excellent thermal conductivity, and that a metal paste using silver is effective also as a binding material or a thermal conductive material for production of a semiconductor device increased in the current and operated at a high temperature, such as a power device.

In the metal paste of the present invention, the number of silver particles having a particle size of 100 to 200 nm needs to be 30% or more based on the number of all silver particles. A metal paste for forming a wiring pattern is required to have a low-temperature sintering property for sintering the metal particle at a low temperature. In the present invention, low temperature sintering is significant for intension of causing sintering to progress at 150° C. or less. In the present invention, the silver particle having the above-described intermediately fine particle size makes a contribution to low temperature sinterability. When the ratio of the silver particle having a particle size of 100 to 200 nm is less than 30%, sintering is not caused at all or insufficiently caused at a low temperature. Even when the upper limit of the ratio of the silver particle having a particle size of 100 to 200 nm is 100%, the effects of the present invention are exhibited.

In the metal paste of the present invention, it is preferable but not necessary that all silver particles contained in the paste have the particle size of 100 to 200 nm, namely, that the ratio is 100%. As long as the ratio of the silver particle having the particle size of 100 to 200 nm is 30% or more, and more preferably 50% or more, a particle having a particle size out of this particle size range may be contained. For example, even a metal paste containing a mixture of a silver particle having a particle size of 100 to 200 nm and a fine silver particle having a particle size of 20 to 30 nm can be sintered at a low temperature of 150° C. or less as long as the ratio of the silver particle having the particle size of 100 to 200 nm is 30% or more, and the thus obtained sintered body has a low resistance value. Alternatively, the metal paste may contain a mixture of the silver particle having the particle size of 100 to 200 nm and a coarse silver particle having a particle size more than 500 nm. A coarse silver particle having a size more than 500 nm (0.5 µm) does not usually sinter at 200° C. or less. When the silver particle having the particle size of 100 to 200 nm used in the present invention is contained in the prescribed ratio or more, however, the whole silver particles including such a coarse particle sinter at a low temperature.

In the present invention, the silver particle having the particle size of 100 to 200 nm may be contained as a mixture with a finer or coarser silver particle in some cases. In the present invention, however, it is necessary that the average particle size (number average) of all the silver particles is 60 to 800 nm. When the average particle size is less than 60 nm, a crack is easily caused when the particles form a sintered body, which may increase the resistance value due to reduction in adhesion in some cases. Besides, when the average particle size exceeds 800 nm, sintering is difficult to proceed, and the resultant sintered body is easily cracked.

In the paste of the present invention, the silver particle, in a state of being protected by a protective agent, is dispersed in a solvent. The protective agent refers to a compound partially or wholly binding to the metal particle suspended in the solvent, and inhibits aggregation of the metal particle. This protective agent relates to a sintering property of the silver particle having the particle size of 100 to 200 nm.

In the present invention, the protective agent binding to the silver particle is an amine compound having 4 or more and 8 or less carbon atoms. The protective agent used in the present invention is limited to an amine compound because if a protective agent excluding amine is used, the sintering of the silver particle at a low temperature is difficult to cause. Besides, the number of carbon atoms of the amine compound used as the protective agent is limited to 4 or more and 8 or less because the number of carbon atoms of the amine affects stability and sintering characteristics of the silver particle in relation to the particle size of the silver particle. Amine having less than 4 carbon atoms is difficult to allow a silver microparticle having a particle size of 100 nm or more to be stably present, and hence a homogeneous sintered body is difficult to form. On the other hand, amine having more than 8 carbon atoms is liable to excessively increase the stability of the silver particle to increase the sintering temperature. Therefore, the protective agent of the present invention is limited to an amine compound having 4 or more and 8 or less carbon atoms.

Besides, as the amine compound, an amine compound having a boiling point of 220° C. or less is preferable. When an amine compound having a boiling point more than 220° C. is bound to a silver particle, even if the particle size range is within an appropriate range, the amine compound is difficult to separate in sintering, which inhibits progress of the sintering.

As for the number of amino groups in the amine compound used as the protective agent, (mono)amine having one amino group, or diamine having two amino groups can be used. Besides, the number of hydrocarbon groups binding to an amino group is preferably one or two, namely, primary amine ($RNH_2$) or secondary amine ($R_2NH$) is preferable. When diamine is used as the protective agent, at least one or more amino groups therein are preferably primary amine or secondary amine. A hydrocarbon group binding to an amino group may be chain hydrocarbon having a linear structure or a branched structure, or a hydrocarbon group having a cyclic structure. Besides, oxygen may be partially contained.

Preferable specific examples of the protective agent used in the present invention include butylamine, isobutylamine, 1,4-diaminobutane, and 3-methoxypropylamine having 4 carbon atoms, pentylamine, neopentylamine, 2-methylbutylamine, 2,2-dimethylpropylamine, 3-ethoxypropylamine, and N,N-dimethyl-1,3-propanediamine having 5 carbon atoms, hexylamine, and 3-isopropoxypropylamine having 6 carbon atoms, heptylamine, benzylamine, and N,N-diethyl-1,3-diaminopropane having 7 carbon atoms, and octylamine and 2-ethylhexylamine having 8 carbon atoms. The protective agent may contain only one amine compound, or may contain a plurality of amine compounds. When a plurality of amine compounds are used as the protective agent, all the compounds may have 4 or more and 8 or less carbon atoms.

As for the amount of the protective agent (amine compound) in the paste of the present invention, a balance between a nitrogen concentration and a silver concentration in the paste is significant. Specifically, a ratio between a nitrogen concentration (% by mass) and a silver particle concentration (% by mass) (N (% by mass)/Ag (% by mass)) is preferably 0.0001 to 0.015. When the ratio is less than 0.0001, the effect of protecting the silver particle is insufficient, and when it exceeds 0.015, a crack may be caused in the sintered body. The nitrogen concentration in the metal paste can be measured by elemental analysis (CHN analysis or the like) of the paste, and the silver particle concentration can be easily obtained based on the mass of the silver particle and the amount of the solvent used in the production of the paste.

(2) Solvent (Mixed Solvent)

As described above, the metal paste of the present invention employs, as the solvent for dispersing the silver particle, the mixed solvent of the solvent A and the solvent B for improving the drawability and the continuous printability. In addition, the mixed solvent is adjusted to have a preferable HSP distance Ra with reference to dihydroterpineol.

(2-1) Solvent A

A solvent essentially used as the solvent A is at least either of dihydroterpineol and terpineol. As described above, dihydroterpineol itself is a solvent with favorable drawability for the silver particle used in the metal paste of the present invention. Besides, terpineol has favorable drawability although not so much as dihydroterpineol. Therefore, these are essential as the solvent A of the present invention.

Dihydroterpineol (menthanol) has α and β structural isomers, and terpineol has α, β, and γ structural isomers, and any of the structures may be used, or a mixture of the structural isomers may be used. Besides, the solvent A may be single one of dihydroterpineol and terpineol, or may be a mixture thereof. When the solvent A is terpineol or a mixture of dihydroterpineol and terpineol, it is necessary to set the HSP distance Ra from dihydroterpineol to 3.0 or less in the mixed solvent with the solvent B. It is noted that terpineol has a HSP distance Ra from dihydroterpineol of 1.2 $MPa^{1/2}$.

(2-2) Solvent B

The solvent B is mixed with the solvent A of dihydroterpineol or the like in order to improve the continuous printability with the drawability maintained. As a prior condition, the solvent B is an organic solvent having a boiling point of 240° C. or more. This boiling point is higher than those of dihydroterpineol (boiling point: 210° C.) and terpineol (boiling point: 219° C.). The solvent B having a high boiling point inhibits a state change of the solvent while maintaining the drawability by inhibiting volatilization of dihydroterpineol and the like.

(i) Solvent B based on HSP Ra and Chemical Structure

An organic solvent preferable as the solvent B according to the study of the present inventors is an organic solvent having a HSP distance Ra from dihydroterpineol of 3.0 $MPa^{1/2}$ or less and containing two or more ester groups in the structure thereof.

As a specific criterion for selecting the solvent B, the HSP distance Ra between the organic solvent and dihydroterpineol should be preferentially used. This is because dihydroterpineol is a solvent contained in the solvent A, and corresponds to the reference (3.0 $MPa^{1/2}$ or less) of the HSP distance Ra of the mixed solvent. The solvent B of the present invention preferably has a HSP distance Ra from dihydroterpineol of preferably 3.0 $MPa^{1/2}$ or less.

Regarding the HSP distance Ra, the HSP is a parameter, prescribed for various organic solvents, by three components of a dispersion term δd, a polar term δp, and a hydrogen bond term δh. Each organic solvent has an inherent HSP in accordance with the structure thereof. The HSP distance Ra with reference to dihydroterpineol can be calculated in accordance with the following equation:

$$Ra = \left((4 \times (\delta d_D - \delta d_B)^2 + (\delta p_D - \delta p_B)^2 + (\delta h_D - \delta h_B)^2\right)^{1/2} \quad \text{[Expression 1]}$$

δ $d_D$, δ $p_D$, δ $h_D$: δd, δp, δh of dihydroterpineol (16.7, 3.5, 6.7)

δ $d_B$, δ $p_B$, δ $h_B$: δd, δp, δh of solvent B

The solvent B preferred in the present invention is one having a HSP distance Ra from dihydroterpineol of 3.0 $MPa^{1/2}$ or less. When a solvent having an Ra of more than 3.0 $MPa^{1/2}$ is mixed as the solvent B, the HSP distance Ra of the resultant mixed solvent from dihydroterpineol is liable to be larger. As a result, the drawability of the resultant metal paste is reduced, and it is concerned that a wiring is difficult to be formed in a designed width/pattern. The Ra of the solvent B is preferably 2.0 $MPa^{1/2}$ or less. The lower limit of the Ra is preferably 1.0 $MPa^{1/2}$ or more.

The solvent B is preferably an organic solvent having a Hilderbrand solubility parameter SP value of 8.5 $(cal/cm^3)^{1/2}$ or more and 9.5 $(cal/cm^3)^{1/2}$ or less. The above-described HSP indicated by a dispersion term δd, a polar term δp, and a hydrogen bond term δh is a vector related to the solubility parameter of a solvent, and the Hilderbrand solubility parameter SP value corresponds to the length of the vector. The SP value of the solvent B can be calculated in accordance with the following equation:

$$SP = \left(\delta d_B^2 + \delta p_B^2 + \delta h_B^2\right)^{1/2} \quad \text{[Expression 2]}$$

δ $d_B$, δ $p_B$, δ $h_B$: δd, δp, δh of solvent B

It is presumed that the solvent B having a HSP distance Ra of 3.0 $MPa^{1/2}$ or less preferably has an SP value within an approximate region. Besides, in consideration of the SP value of dihydroterpineol (8.94 $(cal/cm^3)^{1/2}$) used as the reference for calculating the HSP distance Ra of the solvent B of the present invention, it is presumed that the SP value of the solvent B is preferably within a prescribed range from the SP value of dihydroterpineol. For these reasons, the SP value of the solvent B of the present invention is preferably within the above-described range.

Besides, numeral value ranges of the respective components of the dispersion term δd, the polar term δp, and the hydrogen bond term δh of the HSP of the solvent B of the present invention are preferably $15 \leq \delta d \leq 17$, $2 \leq \delta p \leq 7$, and $2 \leq \delta h \leq 10$.

It is noted that values of the dispersion term δd, the polar term δp, and the hydrogen bond term δh, and calculation methods therefor for the calculation related to the HSP are described in, for example, "INDUSTRIAL SOLVENTS HANDBOOK" (pp. 35 to 65, Marcel Dekker, Inc., issued in 1996), "HANSEN SOLUBILITY PARAMETERS: A USER'S HANDBOOK" (pp. 1 to 41, CRC Press, 1999), "DIRECTORY OF SOLVENTS" (pp. 22 to 29, Blackie Academic & Professional, issued in 1996), and the like. Besides, as a simpler studying method, values of database included in calculation software "Hansen Solubility Parameters in Practice (HSPiP), version 4.1.03" (written by Steven Abbott, Charles M. Hansen, and Hiroshi Yamamoto) can be used. Besides, the calculation can be performed based on a chemical structural formula of a solvent with the calculation software used.

In addition to the selection criterion based on the HSP distance Ra, the solvent B may be selected from the chemical structure aspect. Specifically, the solvent B favorable in the present invention is an organic solvent having at least two ester groups in the structure. This condition on the number of ester groups is obtained as an experimental result by the present inventors. The present inventors considered that an organic solvent having ester groups is preferable because such a solvent can impart an appropriate polarity to a solvent molecule, and hence is effective for dispersion of a particle. On the other hand, a solvent molecule having an amino group, an alcohol group, or a carboxyl group as a polar group adsorbs onto a particle surface or a printing base material as a surfactant, and is concerned to change original properties of the particle or the base material surface. In such a case, wettability of the paste to a base material is so excessively increased that a printing width of a wiring may be greatly larger than a designed width. Therefore, it is presumed that as a group for imparting a polarity to a solvent molecule, an ester group minimally absorbing is suitable. In addition, one having two or more ester groups is favorable. An organic solvent having, as the upper limit, five or less ester groups is preferable.

Specific examples of the solvent B selected based on the Hansen solubility parameter and the chemical structural factor include the following organic solvents:

[Formula 1]

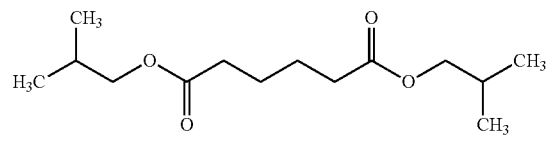

Diisobutyl adipate

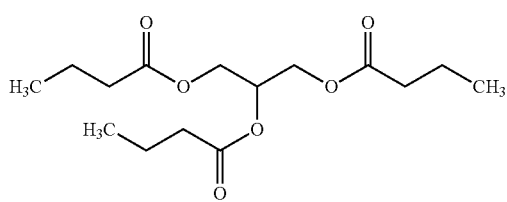

Glycerol tributyrate (tributyrin)

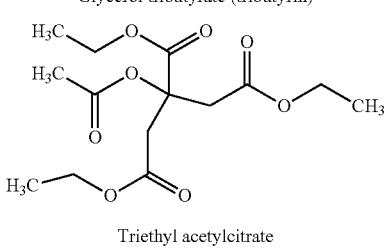

Triethyl acetylcitrate

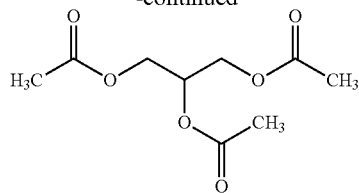

Glycerol triacetate (triacetin)

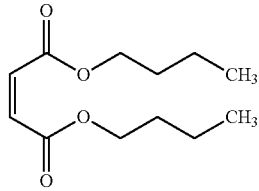

Dibutyl maleate

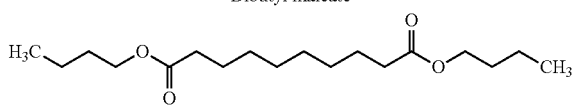

Dibutyl sebacate

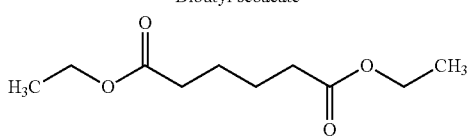

Diethyl adipate (ii) Another High Boiling Point Solvent Usable as Solvent B

As the solvent B, an organic solvent having a HSP distance Ra from dihydroterpineol of more than 3.0 MPa$^{1/2}$ can be used. A requirement necessary in the present invention is a condition that the Ra of the mixed solvent is 3.0 MPa$^{1/2}$ or less, and therefore, even an organic solvent having a HSP distance Ra from dihydroterpineol of more than 3.0 MPa$^{1/2}$ can satisfy the reference as the mixed solvent of the metal paste depending on a mixing ratio with dihydroterpineol.

In this case, specific examples of the organic solvent include texanol (2,2,4-trimethyl-1,3-pentanediolmonoisobutyrate: known under the trade name Nikko NG-120), and butyl glycol acetate. The upper limit of the Ra of another high boiling point solvent that is an organic solvent having a HSP distance Ra from dihydroterpineol of more than 3.0 MPa$^{1/2}$ and usable as the solvent B is preferably up to 5.5 MPa$^{1/2}$.

(2-2) HSP Distance Ra of Mixed Solvent from Dihydroterpineol

The mixed solvent corresponding to the solvent of the metal paste of the present invention has a HSP distance Ra from dihydroterpineol of 3.0 MPa$^{1/2}$ or less. The HSP distance Ra can be calculated in accordance with the following equation 3 based on the HSP ($\delta d_D$, $\delta p_D$, and $\delta h_D$) of dihydroterpineol by calculating the HSP ($\delta d_m$, $\delta p_m$, and $\delta h_m$) of the mixed solvent. Besides, the HSP ($\delta d_m$, $\delta p_m$, and $\delta h_m$) of the mixed solvent can be calculated based on the HSP ($\delta d_A$, $\delta p_A$, and $\delta h_A$) of the solvent A, the HSP ($\delta d_B$, $\delta p_B$, and $\delta h_B$) of the solvent B, and mixing ratios of the solvent A and the solvent B (volume ratios: a, b (a+b=1)) in accordance with the following equation 4:

$$Ra = \{(4 \times (\delta d_D - \delta d_m)^2 + (\delta p_D - \delta p_m)^2 + (\delta h_D - \delta h_m)^2\}^{1/2} \quad \text{[Expression 3]}$$

$\delta d_D$, $\delta p_D$, $\delta h_D$: $\delta d$, $\delta p$, and $\delta h$ of dihydroterpineol (16.7, 3.5, 6.7)

$\delta d_m$, $\delta p_m$, $\delta h_m$: $\delta d$, $\delta p$, and $\delta h$ of mixed solvent $$[\delta d_m, \delta p_m, \delta h_m] = [(a \times \delta d_A + b \times \delta d_B), \quad \text{[Expression 4]}$$
$$(a \times \delta p_A + b \times \delta p_B), (a \times \delta h_A + b \times \delta h_B)]$$

$\delta d_m$, $\delta p_m$, $\delta h_m$: $\delta d$, $\delta p$, and $\delta h$ of mixed solvent
$\delta d_A$, $\delta p_A$, $\delta h_A$: $\delta d$, $\delta p$, and $\delta h$ of solvent A
$\delta d_B$, $\delta p_B$, $\delta h_B$: $\delta d$, $\delta p$, and $\delta h$ of solvent B
a: mixing ratio of solvent A, b: mixing ratio of solvent B When the solvent A and/or the solvent B is a mixed solvent (for example, when the solvent A is a mixed solvent of dihydroterpineol and terpineol), the HSPs of the solvents A and B are calculated in the same manner as the above-described equation 4, and thereafter, the parameter of the mixed solvent may be calculated.

As a value of the HSP distance Ra of the mixed solvent from dihydroterpineol is smaller, the printing drawability of the metal paste can be more favorable, and deviation of a wiring from a designed width can be reduced. Therefore, the HSP distance Ra of the mixed solvent is more preferably 2.5 MPa$^{1/2}$ or less. A metal paste containing the mixed solvent having a HSP distance Ra of 2.5 MPa$^{1/2}$ or less has high printing drawability regardless of the material of a substrate. As described below, examples of the material of the base material include not only glass but also resins such as PET and PEI, and printing drawability is liable to be difficult to be ensured on a glass substrate. When the Ra of the mixed solvent is 2.5 MPa$^{1/2}$ or less, high printing drawability can be ensured also on a glass substrate. The value of the HSP distance Ra of the mixed solvent is particularly preferably 1.0 MPa$^{1/2}$ or less. Thus, extremely high printing drawability can be exhibited on any substrate. The material of the substrate to which the present invention is applicable should, however, not be limited. In this respect, high printing drawability can be exhibited on a resin substrate as long as the HSP distance Ra of the mixed solvent is 3.0 MPa$^{1/2}$ or less.

The mixing ratio between the solvent A and the solvent B is adjusted basically in such a manner that the HSP Ra of the mixed solvent is within a reference value. As a reference of the mixing ratio, in terms of a volume ratio, the solvent A: the solvent B is preferably set to 0.08:0.92 to 0.52:0.48. When the mixing ratio is set in terms of a mass ratio, the solvent B is mixed preferably in 10% by mass or more and 50% by mass or less with respect to the whole mixed solvent.

(2-4) Mixing Ratio between Solid Content and Solvent (Mixed Solvent)

As for a mixing ratio between the solid content (silver particle) and the solvent (mixed solvent) in the metal paste of the present invention, a solvent content is preferably 5% to 60% in terms of a mass ratio. When the content is less than 5%, the viscosity of the resultant paste is too high. When the content exceeds 60%, it is difficult to obtain a sintered body with a necessary thickness. The solvent content is more preferably 25% to 40% in terms of a mass ratio.

(3) Additives
(3-1) First Additive

The metal paste of the present invention essentially contains a high molecular weight ethyl cellulose as the first additive. The high molecular weight ethyl cellulose used as the essential additive improves the basic printability by making preferable the viscosity and a rheology characteristic such as a thixotropic property of the metal paste. The high molecular weight ethyl cellulose is an ethyl cellulose having a number average molecular weight of 40000 to 90000, and preferably an ethyl cellulose having a number average molecular weight of 55000 to 85000. When such a high molecular weight ethyl cellulose is used, a silver particle can be transferred, for printing, to a substrate without causing adhesion of the paste to a squeegee or transfer failure in forming a wiring pattern with the metal paste.

The molecular weight of the ethyl cellulose is set to the above-described high molecular weight in order to make favorable a wiring resistance value after sintering the silver particle. According to the studies of the present inventors, when the number average molecular weight of the ethyl cellulose is too low, the resistance value after the sintering may be high in some cases. Besides, when the number average molecular weight of the high molecular weight ethyl cellulose is too high, the effect of improving the printability is difficult to obtain. Therefore, the above-described high molecular weight ethyl cellulose is employed in consideration of the resistance value of a sintered body in addition to acquisition of the basic printability.

An amount of the high molecular weight ethyl cellulose added to the metal paste is preferably 1.0% by mass or more and 3.0% by mass or less in terms of a mass ratio with respect to the whole metal paste. When the amount is less than 1.0% by mass, the effect of improving the printability is difficult to obtain, and when the amount exceeds 3.0% by mass, the resistance value of the sintered body is so high that functions as a wiring/electrode can be impaired.

(3-2) Second Additive

The metal paste of the present invention contains a polyvinyl acetal resin as the second additive. The second additive makes a contribution to improvement of adhesion between a metal film formed by sintering the silver particle and a substrate. The polyvinyl acetal resin used as the second additive is a resin having an acetal group, an acetyl group, and a hydroxyl group as shown in the following formula 2:

[Formula 2]

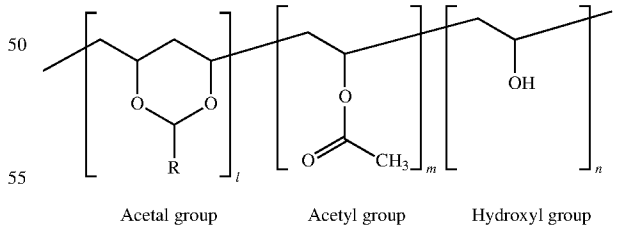

Acetal group     Acetyl group     Hydroxyl group

The polyacetal resin preferably used as the second additive in the present invention is polyvinyl acetoacetal (R=CH$_3$) or polyvinyl butyral (R=C$_3$H$_7$). Besides, it is preferable, in the polyacetal resin, that a mixing ratio of a hydroxyl group is 20% by mol or more and 40% by mol or less, and that the degree of acetalization is 60% by mol or more and 75% by mol or less. Besides, a calculated molecular weight thereof is preferably 1.0×10$^4$ or more and 13×10$^4$ or less.

A content of the polyacetal resin is preferably 10% by mass or more and 70% by mass or less based on the content of the high molecular weight cellulose. When the content is less than 10% by mass, the effect of improving the adhesion is difficult to obtain, and when the content exceeds 70% by mass, a viscoelasticity characteristic, which is required in a metal paste used in a printing method such as screen printing, cannot be obtained. The content of the polyacetal resin is more preferably 10% by mass or more and 50% by mass or less based on the content of the high molecular weight cellulose.

(3-3) Additional Additive (Optional Additive)

The metal paste of the present invention essentially contains the high molecular weight ethyl cellulose and the polyacetal resin as the additives, and another additive may be added if necessary. As an optional additive, a binder containing a high molecular weight resin can be used. Examples of the high molecular weight resin include a polyester resin, a polystyrene resin, a polyethylene resin, an acrylic resin, a phenol resin, a polycarbonate resin, a urethane resin, and an epoxy resin. When such a binder is added to the metal paste of the present invention, adhesion to a liquid crystal polymer can be improved. This binder is contained in a mass ratio, to the metal paste of the present invention, of preferably 0.8 to 2.5%, and particularly preferably 1.0 to 1.5%. The metal paste of the present invention has, however, favorable adhesion to various base materials, and hence the addition of the binder is not essential. Besides, since the present invention is drawn to a metal paste for forming a wiring in the form of a thin film, a glass frit used in a paste for a thick film from a long time ago is not contained. Besides, since the metal film to be used as a wiring is formed by a sintering action of the silver nanoparticle to be thus fixed on a substrate, the metal paste does not contain an adhesive component.

(II) Method for Producing Metal Paste of Invention

A method for producing the metal paste of the present invention will now be described. The metal paste of the present invention is produced by kneading, with the solvent, a solid content containing the silver particle having the particle size of 100 to 200 nm in a ratio of 30% or more, and the first (and second) additive(s).

In the present invention, the solid content containing the silver particle having the particle size of 100 to 200 nm in a ratio of 30% or more is used. Therefore, the production of the silver particle involves control of the particle size and the particle size distribution. A method for producing such a silver particle is described in detail in conventional art (Patent Document 1). A favorable method for producing a silver particle is a pyrolysis method using a silver complex as a precursor. In the pyrolysis method, a pyrolytic silver compound such as silver oxalate ($Ag_2C_2O_4$) or silver carbonate ($Ag_2CO_3$) is used as a starting material, an amine compound used as a protective agent is added thereto to generate a silver-amine complex corresponding to a precursor of the silver particle, and this complex is heated to obtain the silver particle.

In the heating step of a reaction system containing the silver-amine complex, a water content in the reaction system is prescribed. Specifically, the content is set to 5 to 100 parts by mass with respect to 100 parts by mass of the silver compound used as the raw material. This water content seems to act as a buffering agent for causing the heating to homogeneously proceed in a decomposition step of the silver-amine complex. Owing to this buffering action, nuclear generation/nuclear growth of the silver particle is homogenized and accelerated with reducing a temperature difference otherwise caused in the reaction system in the heating.

Besides, in the heating step of the silver-amine complex, a homogenizing agent of an organic compound having amide as a skeleton is favorably added for adjusting the particle size distribution or the like. Examples of the homogenizing agent include not only urea and a urea derivative but also N,N-dimethylformamide (DMF), N,N-diethylformamide (DEF), N,N-dimethylacetamide, N,N-dimethylpropionamide, and N,N-diethylacetamide.

A heating temperature (decomposition temperature) for the reaction system containing the silver-amine complex is preferably set to 90 to 130° C. Besides, a heating speed in the heating step is preferably adjusted in a range of 2.5 to 50° C./min until the set decomposition temperature is reached. Thus, a silver particle having a favorable particle size distribution is precipitated in the heating step. The precipitated silver particle is collected through solid-liquid separation, and appropriately washed to be used as the solid content of the metal paste. As a washing solvent, alcohol such as methanol, ethanol, or propanol is preferable. As described above, dihydroterpineol may be also used.

The collected silver particle is kneaded as the solid content together with the solvent, and thus, the metal paste can be obtained. As the solvent, the above-described mixed solvent can be used. As the mixed solvent, the solvent A and the solvent B may be precedently mixed, and the solid content and the first and second additives may be added simultaneously or successively thereto. Alternatively, the silver particle and either one of the solvents of the solvent A and the solvent B may be precedently mixed, and the resultant mixture may be kneaded with the other solvent. As for the addition of the first and second additives, the additives may be precedently dissolved in either of the solvent A and the solvent B similarly. Besides, the additives may be precedently added to the reaction system containing the silver-amine complex formed in the production process of the silver particle.

(III) Method for Forming Wiring Pattern using Metal Paste of Invention

In a method for forming a wiring pattern using the metal paste of the present invention, the metal paste described so far is applied onto a substrate, and a heat treatment for sintering the silver particle is performed.

The material/shape/dimension of the substrate are not especially limited. Examples of the material of the base material include glass, a resin substrate of PET or the like, a metal substrate, and a ceramic substrate. Particularly owing to the addition of the second additive (polyvinyl acetal resin), the present invention is effective also for a substrate having poor affinity with a metal (silver) such as glass.

A method for applying the metal paste is also not especially limited. In recent years, a screen printing method is employed for forming a fine wiring pattern. The method is, however, not limited to this, but dipping, spin coating, and a dropping method using an application member such as a roll coater or blade/squeegee can be employed.

After applying the metal paste into a desired wiring pattern on the substrate, a firing treatment is performed to form a metal film. The firing treatment is performed for causing the sintering of the silver particle to proceed, and for removing a protective agent component and the like that can remain in the metal film. The firing treatment is performed preferably at 40° C. to 250° C. A temperature less than 40° C. is not preferable because it takes long time to eliminate and volatilize the protective agent. Besides, at a temperature more than 250° C., deformation may be caused depending on the material of the base material. Since the metal paste of the present invention is excellent in the low temperature sinterability, the upper limit of the firing temperature can be 150° C. or less. A firing time is preferably 10 minutes or more and 120 minutes or less. It is noted that the firing step may be performed in an atmospheric atmosphere, or in a vacuum atmosphere.

The silver particle contained in the metal paste is bound/sintered by the firing treatment, and thus, a metal wiring of the metal film in a desired pattern can be formed.

Advantageous Effects of Invention

In a metal paste of the present invention, a solvent for dispersing a silver particle therein is specifically limited to a mixed solvent, and thus, printing drawability and continuous printability are improved. In production of a wiring pattern narrowed and complicated in the future, the metal paste of the present invention can form a wiring pattern in a dimension/shape according to a designed pattern. In addition, the metal paste of the present invention can be fired at a low temperature, and hence a wiring pattern can be formed without damaging/modifying a substrate.

DETAILED DESCRIPTION OF THE PREFERRED EMBODIMENTS

Figure 1:
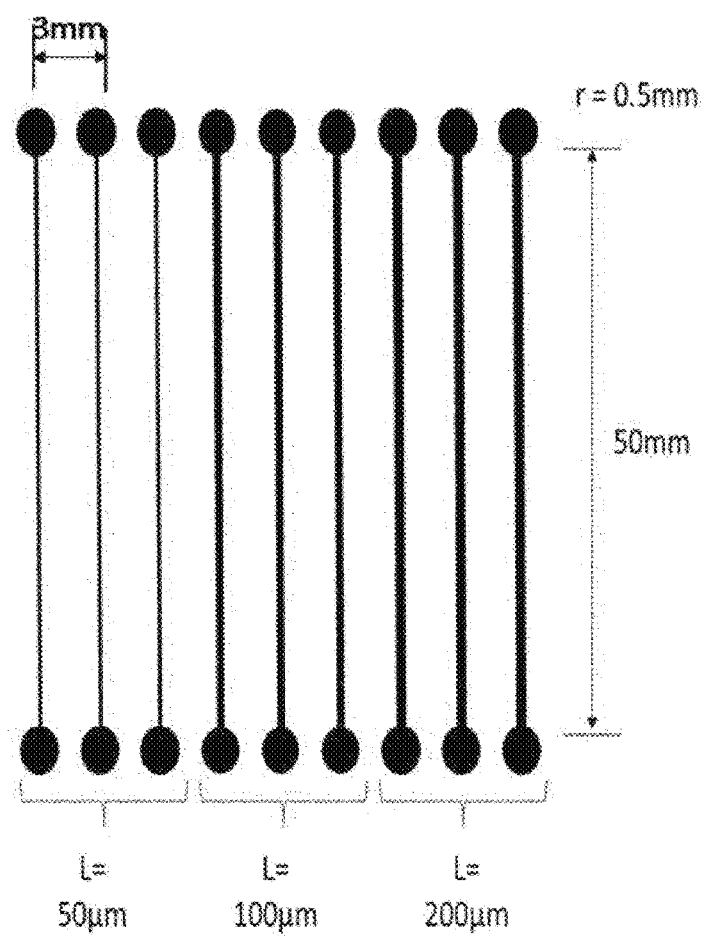
FIG. 1 is a diagram illustrating an appearance of a wiring pattern for evaluating printing drawability and continuous printability of a metal paste.

First Embodiment: A preferred embodiment of the present invention will now be described. In the present embodiment, as preliminary study, metal pastes having the same configuration as that of the conventional technique were first produced using various solvents (single solvents) to confirm whether or not printing drawability thereof were suitable. This preliminary study is conducted for confirming deviation of the width of a formed wiring from a designed width for presuming the cause. In the present embodiment, referring to results of the preliminary study, a plurality of solvents were selected based on the Hansen solubility parameter to produce metal pastes, and printing drawability and continuous printability thereof were evaluated.

Production of Metal Paste

First, a silver particle having the particle size distribution of the present invention was produced by a pyrolysis method. A wet state material obtained by adding 102.2 g of silver carbonate (silver content: 80.0 g) to 37.3 g of water (36.4% by weight with respect to 100 parts by mass of the silver carbonate) was used as a silver compound raw material. To this silver compound, 3-methoxypropylamine, used as an amine compound of a protective agent, was added in a 6-fold amount in terms of a molar ratio to the mass of silver to produce a silver-amine complex.

With a water content in this silver-amine complex adjusted, a homogenizing agent (DMF) was further added thereto. In this reaction system, a decomposition temperature was set to 130° C., and heating was performed from room temperature (at a heating speed of 10° C./min) to decompose the silver-amine complex at 130° C., and thus, silver particles were precipitated. The heating was continued until generation of carbon dioxide was stopped. In this heating step, a liquid in which the silver particles were suspended was obtained. The reaction solution was washed with methanol added thereto, and the resultant was centrifuged to collect the silver particles. The silver particles had an average particle size of 100 nm, and included silver particles having a particle size of 100 to 200 nm in a ratio of 80% or more in terms of the number of particles.

The thus obtained silver particles were added as a solid content to the solvent, and a high molecular weight ethyl cellulose (manufactured by Dow Chemical, ETHOCEL® STD100 (number average molecular weight: 63420)) used as the first additive was further added thereto and the resultant was kneaded to obtain a metal paste. The content of the silver particles corresponding to the solid content was 70% by mass, and the content of the ethyl cellulose (STD100) was 1.7% by mass with respect to the whole metal paste. In this preliminary test, texanol (trade name: Nikko NG-120), butyl glycol acetate, dihydroterpineol, and terpineol were used as the solvent, and four types of metal pastes were produced to have the same mixing ratio of the solvent. The solvents were all commercially available products. Commercially available dihydroterpineol and terpineol are presumed as mixtures of structural isomers, but the proportions thereof are not clear. In the present embodiment, as the respective parameters (δd, δp, and δh) of the HSPs of dihydroterpineol and terpineol, values of compounds in a form were used to calculate the distance Ra or the like. Here, the configuration of the metal paste was 70% by mass of the solid content (silver particles), 2% by mass of the high molecular weight ethyl cellulose, and a balance of the solvent. In this preliminary test, in order to focus on study of the relationship between the solvent and the printing drawability, a polyvinyl acetal resin was not added.

Confirmation of Printing Drawability of Conventional Technique (Preliminary Test)

Figure 2:
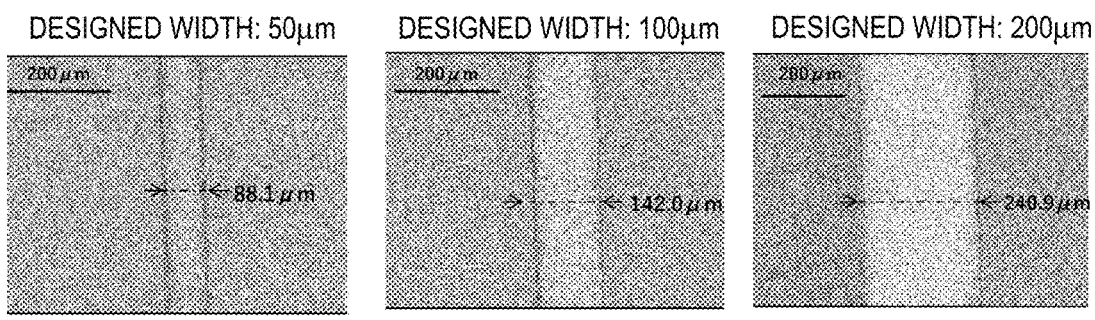
FIG. 2 shows photographs of appearances of wirings printed with metal pastes using, as a solvent, butyl glycol acetate and dihydroterpineol in a preliminary test.
Figure 2:
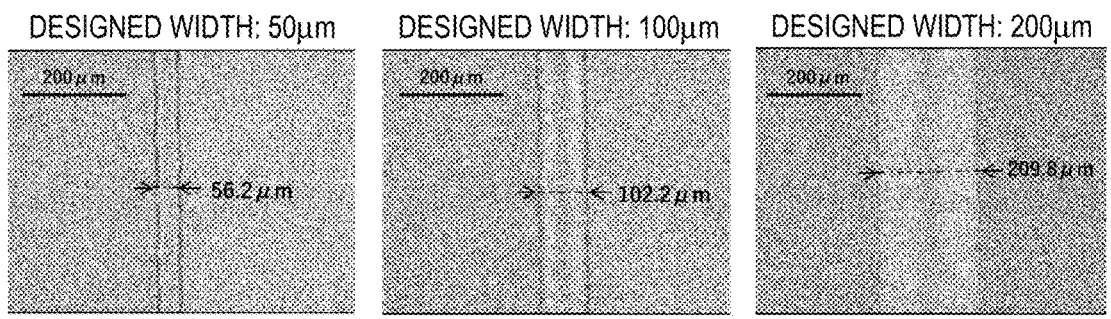

Each of the metal pastes described above was applied/printed in a linear wiring pattern by a screen printing method. The metal paste was printed on a glass substrate from above a screen mask. The printing was performed on a glass substrate with a screen printing device (manufactured by Newlong Seimitsu Kogyo Co., Ltd., LS-150) using a screen mask having a pattern illustrated in FIG. 1 (linear patterns having designed widths of 50 µm, 100 µm and 200 µm) at a printing speed of 50 mm/sec. Thereafter, the resultant was fired at 150° C. for 30 minutes to form linear metal wirings. Then, widths of the thus formed three types of wirings were measured for obtaining an average to calculate deviation. Results of this preliminary test are shown in Table 1. Besides, FIG. 2 illustrates photographs of appearances of the wirings formed with the metal pastes using, as a solvent, butyl glycol acetate and dihydroterpineol.

TABLE 1

| No. | Solvent | Designed width/ μm | Wiring width/ μm | Deviation/ μm |
|---|---|---|---|---|
| 1 | Texanol | 50 | 92.1 | 42.1 |
| 2 | (Nikko NG-120) | 100 | 136.9 | 36.9 |
| 3 |  | 200 | 235.9 | 35.9 |
| 4 | Butyl glycol acetate | 50 | 88.1 | 38.1 |
| 5 |  | 100 | 142.0 | 42.0 |
| 6 |  | 200 | 240.9 | 40.9 |
| 7 | Dihydroterpineol | 50 | 56.2 | 6.2 |
| 8 |  | 100 | 102.2 | 2.2 |

TABLE 1-continued

| No. | Solvent | Designed width/ μm | Wiring width/ μm | Deviation/ μm |
|---|---|---|---|---|
| 9 |  | 200 | 209.8 | 9.8 |
| 10 | Terpineol | 50 | 65.1 | 15.1 |
| 11 |  | 100 | 113.6 | 13.6 |
| 12 |  | 200 | 210.5 | 10.5 |

As a result of this preliminary test, it is confirmed that the metal pastes using the same type of solvent have deviation of substantially the same value regardless of the designed width. This value of the deviation varies depending on the solvent, but the values are liable to be the same with respect to the respective solvents as described above. Based on this result, the present inventors presume that the behavior of a solvent is largely involved in the printing drawability.

Besides, it was confirmed in this preliminary test that dihydroterpineol is the optimum solvent from the viewpoint of the printing drawability. In addition, it is deemed that terpineol is a preferable solvent second to dihydroterpineol in the printing drawability. In the embodiment of the present invention, as an acceptance criterion for printing drawability, deviation of 20 μm or less was determined as good drawability (acceptable=good) regardless of the designed width. The acceptance criterion was determined as 20 μm or less referring to terpineol, a known solvent which was comparatively good in deviation (about 12 to 13 μm on average) in the preliminary test, and because in consideration of forming of a wiring with a width less than 50 μm that can be required in the future, it is presumed that the deviation needs to be less than a half of this wiring width.
Production/evaluation of Metal Paste of Embodiment using Mixed Solvent In consideration of the results of the preliminary test, the present inventors decided to produce/evaluate a metal paste using, as a solvent, a mixed solvent of dihydroterpineol as the solvent A and the solvent B.

Selection of Solvent B

In the present embodiment, as the solvent B contained in the mixed solvent together with the solvent A, organic solvents shown in Table 2 were used. Table 2 shows the boiling point, the respective components of the Hansen solubility parameter (the dispersion term $\delta d$, the polar term $\delta p$, and the hydrogen bond term $\delta h$), the HSP distance Ra from dihydroterpineol, and the HSP SP value of each solvent.

TABLE 2

| Solvent No. | Name of solvent | Boiling point/ °C | Number of ester groups | Hansen solubility parameter | | | Ra/ MPa$^{1/2}$ | SP/ (cal/cm$^3$)$^{1/2}$ |
|---|---|---|---|---|---|---|---|---|
| | | | | $\delta d$ | $\delta p$ | $\delta h$ | | |
| A-1 | Dihydroterpineol | 208.9 | — | 16.7 | 3.5 | 6.7 | — | 8.94 |
| B-1 | Diisobutyl adipate | 293.0 | 2 | 16.7 | 2.5 | 6.2 | 1.12 | 8.78 |
| B-2 | Glycerol tributyrate | 305.0 | 3 | 16.3 | 2.5 | 7.0 | 1.32 | 8.74 |
| B-3 | Acetylcitric acid triethyl ester | 355.7 | 4 | 16.6 | 3.5 | 8.6 | 1.91 | 9.28 |
| B-4 | Glycerol triacetate | 259.0 | 3 | 16.5 | 4.5 | 9.1 | 2.63 | 9.45 |
| B-5 | Dibutyl maleate | 280.0 | 2 | 16.5 | 6.1 | 7.2 | 2.68 | 9.27 |
| B-6 | Dibutyl sebacate | 349.0 | 2 | 16.7 | 4.5 | 4.1 | 2.79 | 8.67 |
| B-7 | Diethyl adipate | 291.3 | 2 | 16.4 | 6.2 | 7.5 | 2.88 | 9.31 |
| C-1 | Texanol (Nikko NG-120) | 248.0 | — | 15.1 | 6.1 | 9.8 | 5.16 | 9.27 |

* Ra: HSP distance from dihydroterpineol.

As the production step of each metal paste of the present embodiment, the same silver particles as those used in the preliminary test were used, the silver particles were mixed with the solvent A, and then the solvent B was mixed therewith to obtain the metal paste. Besides, as ethyl cellulose corresponding to the first additive, the same as that described above was added in the same amount, and as the polyvinyl acetal resin corresponding to the second additive, a polyvinyl butyral resin (manufactured by Sekisui Chemical Company, Limited., S-LEC BH-S) was added in an amount of 33% by mass with respect to the ethyl cellulose. These additives were added after mixing the silver particles with the solvents. Besides, a mixing ratio between the solvent A and the solvent B was set to a mass ratio of the solvent A: the solvent B of 6:1 (as for mixing ratio in terms of volume ratio, refer to Table 3 below).

After producing the metal pastes respectively using the various solvents B, the respective metal pastes were screen printed to evaluate the printing drawability and the continuous printability. In a test for evaluating the printing drawability, the same printing device as that used in the preliminary test was used to print the pattern of FIG. 1 at a printing speed of 50 mm/sec. After applying each metal paste by printing, a firing treatment was performed at 150° C. for 30 minutes to obtain metal wirings. As the evaluation of the printing drawability, the deviation was measured in all the thus formed metal wirings (3 types of widths×3 wirings) after the printing step, and when the average of the deviation was 20 μm or less from the designed width, the drawability was determined as "good". Alternatively, when the average of the deviation was more than 20 μm, the drawability was determined as "poor".

In a test for evaluating the continuous printability, a screen mask on which 200 slits (wiring pitch: 0.3 mm) with a line width of 20 μm (length: 100 mm) were formed as a wiring pattern was used. Each of the metal pastes was used for performing continuous 100 printing operations. A printing device used here was the same as that used in the preliminary test and the like. In the evaluation of the continuous printability, during the continuous printing, wirings formed in the 3rd, 20th, 40th, 60th, and 100th printing operations were observed in optical microscope images. In the observation performed after each printing operation, 3 wirings were optionally selected from the printed 200 wirings, and the whole lengths of these were observed to check whether or not the wirings had disconnection. Then, when any one of the selected wirings had 2 or more disconnection portions, it was determined that printing blur was caused. A metal paste with which printing blur was not caused even in the 100th printing operation was evaluated to have "good" continuous printability, and a metal paste with which printing blur was caused before the 100th printing operation was evaluated to have "poor" continuous printability. The results of the printing drawability and the continuous printability obtained by the printing test are shown in Table 3.

TABLE 3

| Paste No. | Solvent A | Solvent B | Mixing ratio (volume ratio) Solvent A | Mixing ratio (volume ratio) Solvent B | Ra/ MPa$^{1/2}$ | Printing drawability Average deviation/μm | Printing drawability Evaluation | Continuous printability Evaluation |
|---|---|---|---|---|---|---|---|---|
| P-1 | Dihydroterpineol | Diisobutyl adipate | 0.85 | 0.15 | 0.17 | 11.63 | good | good |
| P-2 | | Glycerol tributyrate | 0.86 | 0.14 | 0.18 | 4.19 | good | good |
| P-3 | | Acetylcitric acid triethyl ester | 0.87 | 0.13 | 0.25 | 10.73 | good | good |
| P-4 | | Glycerol triacetate | 0.87 | 0.13 | 0.33 | 9.41 | good | good |
| P-5 | | Dibutyl maleate | 0.86 | 0.14 | 0.38 | 11.96 | good | good |
| P-6 | | Dibutyl sebacate | 0.85 | 0.15 | 0.42 | 11.96 | good | good |
| P-7 | | Diethyl adipate | 0.86 | 0.14 | 0.41 | 13.13 | good | good |
| P-8 | | Dihydroterpineol | | 1.00 | 0.00 | 8.94 | good | poor |
| P-9 | | Texanol (Nikko NG-120) | | 1.00 | 5.16 | 49.66 | poor | good |

* Ra: HSP distance of mixed solvent from dihydroterpineol.

Figure 3:
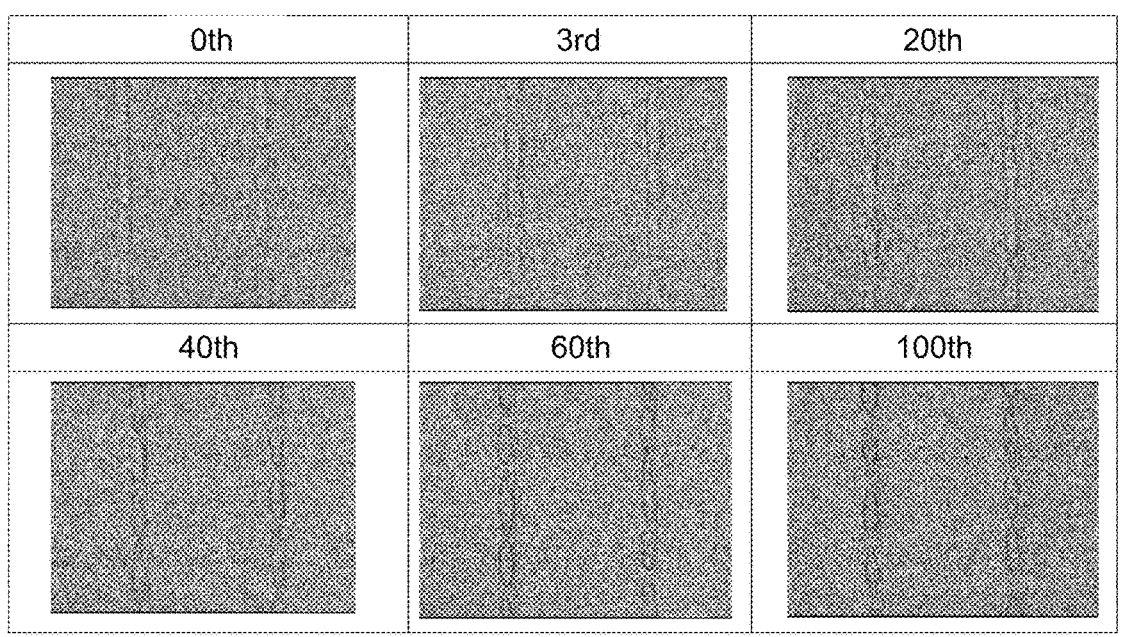
FIG. 3 shows photographs of appearances of wirings (solvent: dihydroterpineol) having printing blur in an evaluation test for the continuous printability of First Embodiment.

It was confirmed, based on Table 3, that the mixed solvents used in the present embodiment had a HSP distance Ra from dihydroterpineol of 1.0 MPa$^{1/2}$ or less, and that the metal pastes obtained therefrom exhibited extremely good printing drawability (P-1 to P-7). It is deemed that the metal paste using the single solvent of dihydroterpineol (P-8) was the best in the printing drawability. The metal paste using the single solvent of dihydroterpineol was, however, poor in the continuous printability. FIG. 3 illustrates photographs of printing blur found in the wirings formed with the paste P-8 (using the single solvent of dihydroterpineol). In using the metal paste containing only dihydroterpineol as the solvent, wiring disconnection started to be caused in a plurality of portions at the time of the 3rd printing operation, and in the 100th printing operation, the wiring was blurred and dotted with island-shaped metals. In using texanol, that is, the solvent of the conventional metal paste (P-9), although the continuous printability was favorable, the printing drawability was largely inferior. This result matches the result of the preliminary test.

Next, an evaluation test on adhesion of wirings obtained from the respective metal pastes was performed. As for the adhesion, some of the metal pastes, that is, a paste P-2 (solvent B: glycerol tributyrate), a paste P-3 (solvent B: acetylcitric acid triethyl ester), and the paste P-8 (single solvent of dihydroterpineol) were evaluated. In the evaluation of these three metal pastes, ones not containing the second additive of the polyacetal resin were produced for comparison.

In the evaluation test for the adhesion, a screen printing device similar to that described above was used to print the same wiring pattern (once). A firing treatment after the printing was performed at three types of firing temperatures of 60° C., 80° C., and 100° C., and metal wirings produced at the respective firing temperatures were evaluated for adhesion. The metal pastes containing no polyacetal resin as comparative examples were sintered only at the firing temperature of 100° C. The adhesion of the printed wirings was evaluated by a peel test. In the peel test, an adhesive tape (ASTM D3359 Cross Hatch Adhesion Test Tape) was adhered to a region having a wiring formed on a substrate, and was then peeled all at once. After peeling the adhesive tape, when all the wirings were not peeled, the adhesion was determined as "good". When even one of the wirings was peeled, the adhesion was determined as "poor". Evaluation results of the adhesion of the wirings are shown in Table 4.

TABLE 4

| Paste No. | Solvent A | Solvent B | Second additive | Firing temperature/ ° C. | Adhesion |
|---|---|---|---|---|---|
| P-2 | Dihydroterpineol | Glycerol tributyrate | used | 60 | good |
| | | | | 80 | good |
| | | | | 100 | good |
| | | | not used | 100 | poor |
| P-3 | | Acetylcitric acid triethyl ester | used | 60 | good |
| | | | | 80 | good |

TABLE 4-continued

| Paste No. | Solvent A | Solvent B | Second additive | Firing temperature/ °C. | Adhesion |
|---|---|---|---|---|---|
| | | | | 100 | good |
| | | | not used | 100 | poor |
| P-8 | | Dihydroterpineol | used | 60 | good |
| | | | | 80 | good |
| | | | | 100 | good |
| | | | not used | 100 | poor |

It was confirmed, based on Table 4, that the adhesion of the metal wiring is largely improved by adding the polyvinyl acetal resin to the metal paste as the second additive. It was also found that the adhesion of the metal wiring is favorable even if the firing temperature is comparative low (60° C.). The peel test of the present embodiment is a test method in which a metal film is forcedly peeled, and shows comparatively severe determination result on the adhesion. It was confirmed that the polyacetal resin used as the second additive can ensure adhesion of a wiring even under such a severe condition.

Second Embodiment: In the present embodiment, metal pastes containing mixed solvents using, as the solvent B, organic solvents having comparative large HSP distances Ra from dihydroterpineol (Ra: more than 3.0 MPa$^{1/2}$) were produced/evaluated. Metal pastes obtained by adjusting the mixing ratio in the mixed solvent of the solvent B (Ra: 3.0 MPa$^{1/2}$ or less) evaluated in First Embodiment were also studied. Organic solvents used in the present embodiment are shown in Table 5.

TABLE 5

| Solvent No. | Name of solvent | Boiling point/ °C. | Ra/ MPa$^{1/2}$ | SP/ (cal/cm$^3$)$^{1/2}$ |
|---|---|---|---|---|
| A-1 | Dihydroterpineol | 208.9 | — | 8.94 |
| A-2 | Terpineol | 219.0 | 1.10 | 9.27 |
| B-2 | Glycerol tributyrate | 305.0 | 1.32 | 8.74 |
| B-3 | Acetylcitric acid triethyl ester | 355.7 | 1.91 | 9.28 |
| B-9 | Nikko MARS | 264.0 | 7.58 | 5.30 |
| B-10 | Texanol (Nikko NG-120) | 248.0 | 5.16 | 9.27 |

* Ra is an HSP distance from dihydroterpineol.

Also in the present embodiment, the metal pastes were produced through the same steps and configurations as those employed in First Embodiment. Then, the printing test (for evaluation of the printing drawability and evaluation of the continuous printability) and the adhesion evaluation (peel test) were performed in the same manner as in First Embodiment. In the present embodiment, a PET substrate and a PEI substrate were used as substrates instead of the glass substrate used in First Embodiment, and the printing drawability and the like on the respective substrate materials were evaluated (only the adhesion was evaluated using a glass substrate). The dimension of each substrate and the printing pattern were the same as those of First Embodiment. Test results of the metal pastes of the present embodiment are shown in Table 6.

TABLE 6

| Paste No. | Solvent A | Solvent B | Mixing ratio (volume ratio) Solvent A | Solvent B | Ra/ MPa$^{1/2}$ | Printing drawability Glass | PET | PEI | Continuous printability | Adhesion |
|---|---|---|---|---|---|---|---|---|---|---|
| P-10 | Dihydroterpineol | Nikko MARS | 0.80 | 0.20 | 1.52 | good | good | good | good | good |
| P-11 | Terpineol | | 0.80 | 0.20 | 2.32 | good | good | good | good | good |
| P-12 | Dihydroterpineol | Texanol (Nikko NG-120) | 0.80 | 0.20 | 1.03 | good | good | good | good | good |
| P-13 | Terpineol | | 0.50 | 0.50 | 2.77 | poor | good | good | good | good |
| P-14 | | | 0.20 | 0.80 | 4.18 | poor | poor | poor | good | good |
| P-15 | Dihydroterpineol | Glycerol tributyrate | 0.86 | 0.14 | 0.18 | good | good | good | good | good |
| P-16 | Dihydroterpineol | Acetylcitric acid triethyl ester | 0.87 | 0.13 | 0.25 | good | good | good | good | good |
| P-17 | Dihydroterpineol | — | 1.00 | | 0.00 | good | good | good | poor | good |
| P-18 | Terpineol | — | 1.00 | | 1.17 | good | good | good | poor | good |

* Ra is an HSP distance of mixed solvent from dihydroterpineol.
* Adhesion was evaluated on a wiring formed on a glass substrate at a firing temperature of 100° C.

It had been confirmed, based on the results of the preliminary test, that texanol is a solvent inferior in the printing drawability as the single solvent. Besides, it was predicted that Nikko MARS having a HSP Ra close to it was the same. It was, however, confirmed that these solvents can form a favorable mixed solvent when mixed as the solvent B with dihydroterpineol (solvent A). It is understood that when the HSP Ra of the mixed solvent adjusted by the mixing ratio of the solvent B is more than 3.0 MPa$^{1/2}$, the printing drawability is reduced on all the materials of the base materials. When the Ra of the mixed solvent is 2.5 MPa$^{1/2}$ or less, such a solvent is effective for both a glass substrate and a resin substrate, and even when it is 3.0 MPa$^{1/2}$ or less, the drawability on a resin substrate is favorable. Glycerol tributyrate and acetylcitric acid triethyl ester, that is, the solvent B favorable from the viewpoint of the HSP Ra, do not largely increase the Ra of the mixed solvent even if the mixing ratio is increased, and exhibit favorable printing drawability and continuous printability. It is noted that the adhesion of a wiring was favorable in all owing to the addition of the polyacetal resin.

INDUSTRIAL APPLICABILITY

As described so far, a silver paste of the present invention is favorable in both drawability and continuous printability. The present invention enables a wiring pattern having a width of 100 μm or less to be accurately formed. The present invention is favorable for formation of electrodes and wirings of electric/electronic devices such as an LED element, and a power semiconductor device.

What is claimed is:

1. A metal paste comprising a solid content of a silver particle having a protective agent bound to the particle and kneaded with a solvent,
    wherein the metal paste does not comprise a glass powder;
    the solid content comprises silver particles including a silver particle having a particle size of 100 to 200 nm in a ratio of 30% or more in terms of the number of particles, and an average particle size of the whole silver particles is 60 to 800 nm,
    the protective agent bound to the silver particle is at least one amine compound having 4 or more and 8 or less carbon atoms,
    the solvent is a mixed solvent in which at least two organic solvents of a solvent (A) and a solvent (B) are mixed,
    the solvent (A) is at least either dihydroterpineol or terpineol,
    the solvent (B) comprises at least one organic solvent having a boiling point of 240° C. or more and a Hansen solubility parameter distance Ra from dihydroterpineol of 3.0 MPa$^{1/2}$ or less and containing two or more ester groups in a structure thereof,
    the mixed solvent has a Hansen solubility parameter distance Ra from dihydroterpineol of 0.42 MPa$^{1/2}$ or less,
    the metal paste further comprises a high molecular weight ethyl cellulose having a number average molecular weight of 40000 to 90000 as a first additive, and a polyvinyl acetal resin as a second additive, and
    the solvent (B) is selected from the group consisting of diisobutyl adipate, glycerol tributyrate, acetylcitric acid triethyl ester, glycerol triacetate, dibutyl sebacate and diethyl adipate.

2. The metal paste according to claim 1, wherein a content of the high molecular weight ethyl cellulose that is the first additive is 1.0% by mass or more and 3.0% by mass or less in terms of a mass ratio with respect to the whole metal paste.

3. The metal paste according to claim 1, wherein a content of the second additive is 10% by mass or more and 70% by mass or less based on a content of the first additive.

4. The metal paste according to claim 1, wherein the amine compound that is the protective agent is butylamine, 1,4-diaminobutane, 3-methoxypropylamine, pentylamine, 2,2-dimethylpropylamine, 3-ethoxypropylamine, N,N-dimethyl-1,3-diaminopropane, 3-ethoxypropylamine, hexylamine, heptylamine, N,N-diethyl-1,3-diaminopropane, benzylamine, isobutylamine, or 3-isopropoxypropylamine.

\* \* \* \* \*